(12) United States Patent
Lai

(10) Patent No.: US 8,019,393 B2
(45) Date of Patent: Sep. 13, 2011

(54) SIGNAL RECEIVER CIRCUIT

(75) Inventor: Jung-Chin Lai, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 942 days.

(21) Appl. No.: 11/955,400

(22) Filed: Dec. 13, 2007

(65) Prior Publication Data

US 2009/0042531 A1 Feb. 12, 2009

(30) Foreign Application Priority Data

Aug. 8, 2007 (TW) .............................. 96129215 A

(51) Int. Cl.
*H04B 1/38* (2006.01)
*G11C 5/14* (2006.01)
(52) U.S. Cl. .................... 455/571; 455/333; 365/227
(58) Field of Classification Search ............... 455/232.1, 455/333, 355, 571; 365/226, 227; 375/319
See application file for complete search history.

(56) References Cited

U.S. PATENT DOCUMENTS

| | | | |
|---|---|---|---|
| 5,578,942 A | 11/1996 | Shimoda et al. | |
| 5,903,498 A * | 5/1999 | Campardo et al. | 365/189.11 |
| 6,020,769 A | 2/2000 | Vallancourt | |
| 7,652,934 B2 * | 1/2010 | Sako | 365/227 |
| 2007/0008802 A1 | 1/2007 | Joo et al. | |

OTHER PUBLICATIONS

"1st Office Action of Germany Counterpart Application", issued on Mar. 16, 2010, with English Translation thereof, p. 1-p. 9.
"Office Action of Taiwan Counterpart Application", issued on Aug. 20, 2010, p. 1-p. 3.

* cited by examiner

*Primary Examiner* — Quochien B Vuong
(74) *Attorney, Agent, or Firm* — Jianq Chyun IP Office

(57) ABSTRACT

A signal receiver circuit including a transmission gate, a pull-low unit, a boost capacitor, a voltage division unit, and a receiver unit is provided. The transmission gate determines whether to conduct an input signal according to a control signal. The pull-low unit determines whether to pull down the voltage at a terminal of the boost capacitor according to the control signal. The boost capacitor boosts the input signal of the receiver unit. The voltage division unit sends a divided voltage to another terminal of the boost capacitor according to the control signal. When an input signal is received, the boost capacitor boosts the input signal, for overcoming low current issue caused by high threshold voltage of MOS transistors and accordingly the receiver unit achieves full swing.

14 Claims, 4 Drawing Sheets

SIGNAL RECEIVER CIRCUIT

CROSS-REFERENCE TO RELATED APPLICATION

This application claims the priority benefit of Taiwan application serial no. 96129215, filed on Aug. 8, 2007. The entirety of the above-mentioned patent application is hereby incorporated by reference herein and made a part of this specification.

BACKGROUND OF THE INVENTION

1. Field of the Invention

The present invention generally relates to a signal receiver circuit, in particular, to a signal receiver circuit which can output a full-swing output signal.

2. Description of Related Art

Regarding a signal receiver circuit in a dynamic random access memory (DRAM), if N-type metal oxide semiconductor (NMOS) transistors in N-type differential amplifiers have high threshold voltage, current restriction issues may limit the operation of the entire circuit, and the duty cycle of the signal receiver circuit may be unbalanced.

FIG. 1 illustrates a conventional signal receiver circuit. The signal receiver circuit includes transistors M1~M4, an inverter INVR, and a resistor $R_D$. The gate of the transistor M1 is coupled to a node N1, the source thereof is coupled to a voltage source VDD, and the drain thereof is coupled to both the input terminal of the inverter INVR and the drain of the transistor M3. The gate of the transistor M2 is coupled to the node N1, the source thereof is coupled to the voltage source VDD, and the drain thereof is coupled to the node N1.

The gate of the transistor M3 is coupled to an input voltage VIN, the source thereof is coupled to both the first terminal of the resistor $R_D$ and the source of the transistor M4, and the drain thereof is coupled to both the input terminal of the inverter INVR and the drain of the transistor M1. The gate of the transistor M4 is coupled to a reference voltage VREF, the source thereof is coupled to both the first terminal of the resistor $R_D$ and the source of the transistor M3, and the drain thereof is coupled to the node N1. The first terminal of the resistor $R_D$ is coupled to both the sources of the transistors M3 and M4, and the second terminal thereof is coupled to ground. The input terminal of the inverter INVR is coupled to both the drains of the transistors M1 and M3, and the output terminal thereof outputs an output voltage Vout.

The reference voltage VREF is half of the voltage source VDD. If the voltage source VDD is 1.5V, then the reference voltage VREF is 0.75V. When the input voltage VIN is 0.925V, the output terminal Vout outputs a signal of 1.5V (i.e. logic high level). If the input voltage VIN is 0.575V, the output terminal Vout outputs a signal of 0V (i.e. logic low level). Because the threshold voltage of the transistor M3 is high and the voltage $V_{GS}$ between the gate and the source thereof is restricted by the input voltage VIN, the drain-source current $I_{DS}$ of the transistor M3 is not sufficient for supporting full swing at the input terminal of the inverter INVR, which causes unbalanced duty cycle of the output voltage Vout (i.e., the duty cycle of the output voltage Vout cannot reach 50%).

As described above, a signal receiver circuit, which can boost the input voltage VIN, namely, increases the gate-source voltage $V_{GS}$ of the transistor M3, and accordingly can provide a high drain-source current $I_{DS}$ and balance the duty cycle of the output voltage, is to be provided.

SUMMARY OF THE INVENTION

Accordingly, the present invention is directed to a signal receiver circuit, wherein an input signal is boosted to increase the voltage between the gate and the source of MOS transistors in the signal receiver circuit, and a high drain-source current is provided to balance the duty cycle of the signal receiver circuit.

One example of the present invention provides a signal receiver circuit including a transmission gate, a pull-low unit, a boost capacitor, a voltage division unit, and a receiver unit. The transmission gate has an input terminal for receiving an input signal, an output terminal coupled to a first node, and a control terminal coupled to a control signal. The transmission gate determines whether to conduct the input signal according to the control signal. The pull-low unit determines whether to pull down the voltage of the first node according to the control signal. The boost capacitor has a first terminal coupled to the first node and a second terminal coupled to a second node. The voltage division unit determines whether to divide a reference voltage and send a divided voltage to the second node according to the control signal. The receiver unit has a first input terminal coupled to the second node, a second input terminal coupled to a voltage source, and an output terminal for outputting an output signal. The logic high level and logic low level of the second node are both higher than the logic high level and logic low level of the input signal.

According to another example of the present invention, the control signal is generated by a control signal generator. When the output signal of the receiver unit transits to logic low level, the control signal transits (for example, from logic low level to logic high level) and maintain for a while. After that, the control signal transits back to logic low level. Besides, when the signal receiver circuit is powered on, the control signal also transits into logic high level. Substantially, the control signal remains at logic low level in all other time.

Still another example of the present invention provides a voltage booster suitable for a signal receiver circuit of a semiconductor memory. The voltage booster includes a transmission gate, a pull-low unit, a boost capacitor, a voltage division unit, and a control signal generator. The transmission gate determines whether to conduct an input signal according to a control signal. The pull-low unit determines whether to pull down the voltage of a first node according to the control signal. The boost capacitor has a first terminal coupled to the first node and a second terminal coupled to a second node. The voltage division unit determines whether to divide a reference voltage and send a divided voltage to the second node according to the control signal. The control signal generator generates the control signal according to the power on state and an output signal of the signal receiver circuit. The signal at the second node is used as the input signal of the receiver unit. Via the coupling effect of the boost capacitor, the logic high level and logic low level of the input signal of the receiver unit are both higher than the logic high level and logic low level of the input signal of the voltage booster.

According to the examples of the present invention, a boost capacitor is adopted in the signal receiver circuit for boosting an input signal (for example, by 0.1V). Moreover, the boost capacitor is recharged according to a control signal when the output signal decreases. Thereby, voltage reduction issue caused by leakage current can be resolved. Furthermore, it can be observed from a circuit simulation that the duty cycle of the signal receiver circuit according to example of the present invention is improved from 20%/80% to 50%/50%.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
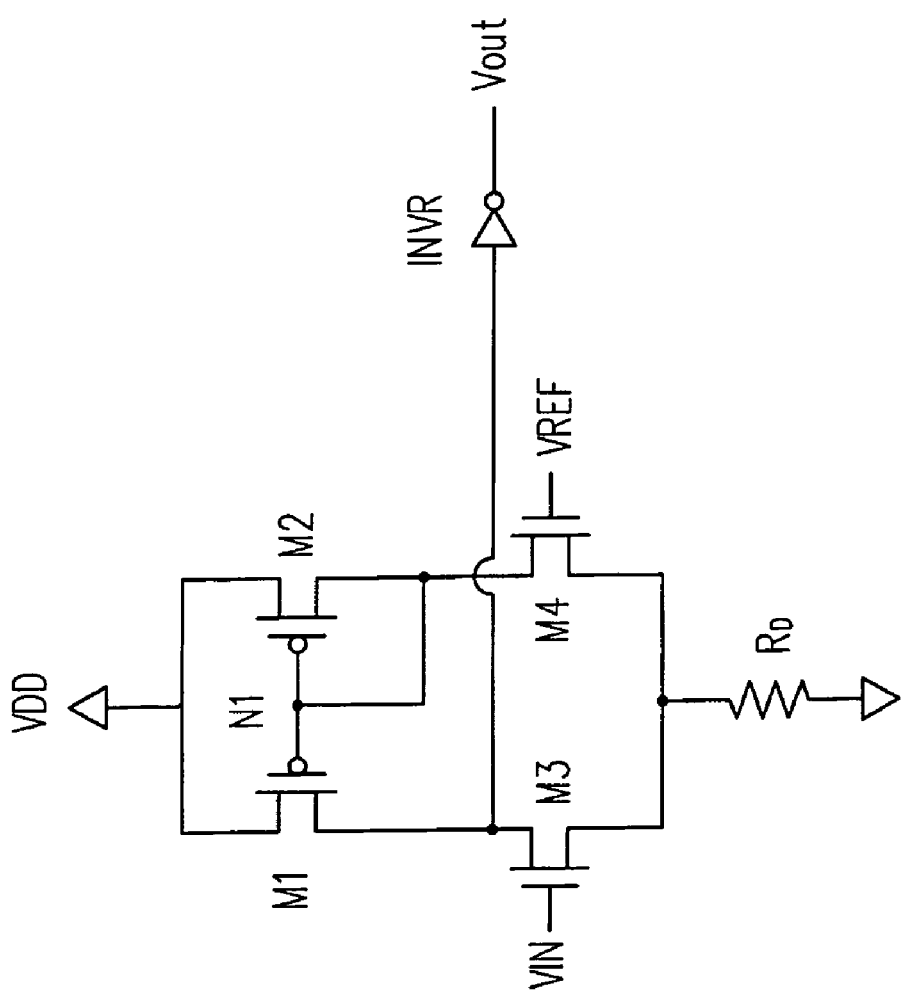
FIG. 1 is a diagram of a conventional signal receiver circuit.

Reference will now be made in detail to the present preferred embodiments of the invention, examples of which are illustrated in the accompanying drawings. Wherever possible, the same reference numbers are used in the drawings and the description to refer to the same or like parts.

Figure 2:
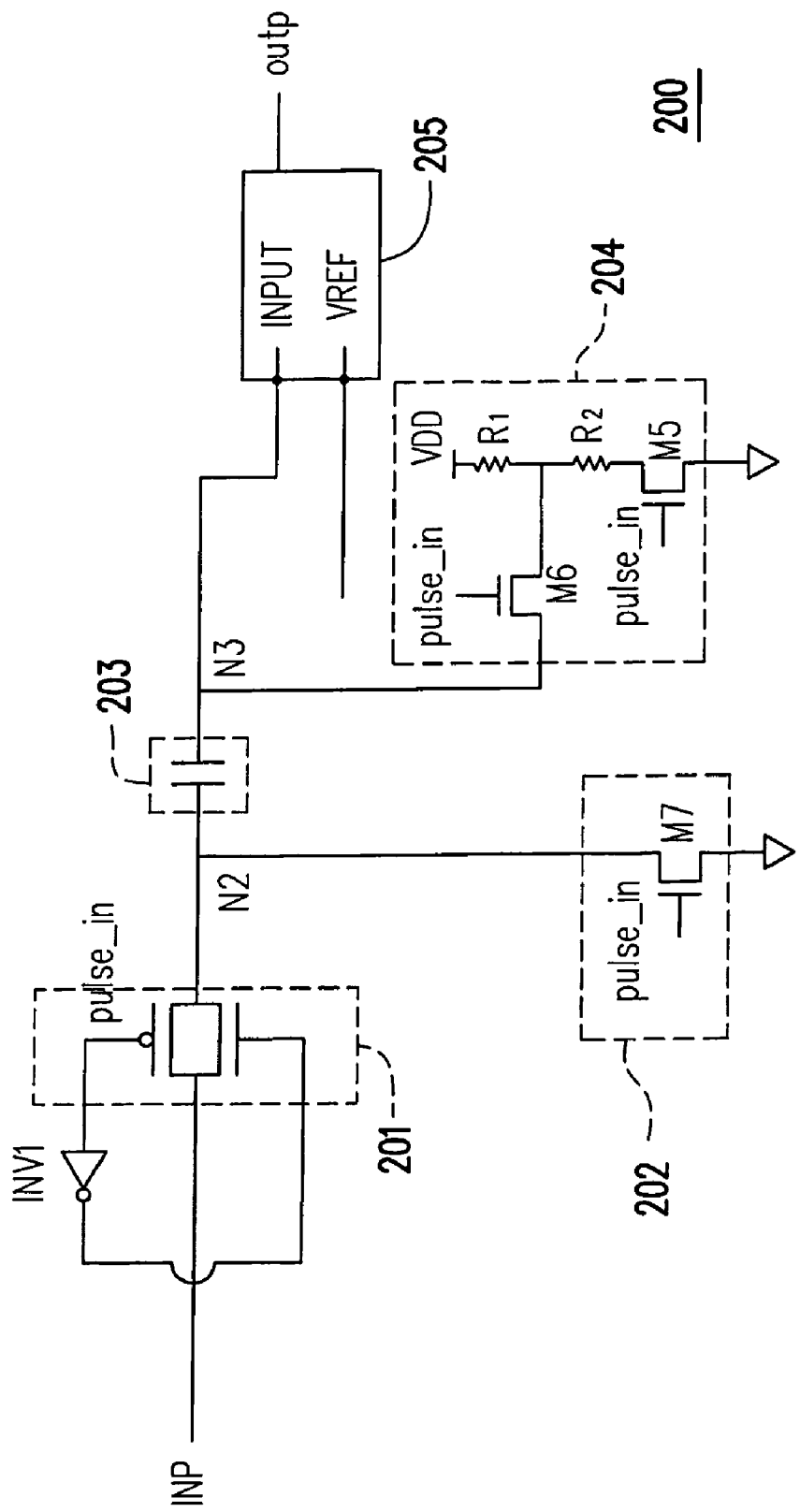
FIG. 2 is a diagram of a signal receiver circuit according to an embodiment of the present invention.

FIG. 2 is a block diagram of a signal receiver circuit according to an embodiment of the present invention. The signal receiver circuit 200 includes a transmission gate 201, a pull-low unit 202, a boost capacitor 203, a voltage division unit 204, and a receiver unit 205.

The transmission gate 201 determines whether to conduct the input signal INP according to the control signal pulse_in. However, the present embodiment is not limited thereto, and the transmission gate 201 may also have other suitable structures. The input terminal of the transmission gate 201 receives the input signal INP, the output terminal thereof is coupled to node N2, the first control terminal thereof is coupled to the control signal pulse_in, and the second control terminal thereof is coupled to the output terminal of the inverter INV1 (namely, the second control terminal thereof receives an inverted signal of the control signal pulse_in).

When the control signal pulse_in is at logic high level, the transmission gate 201 does not conduct the input signal INP to node N2. When the control signal pulse_in is at logic low level, the transmission gate 201 conducts the input signal INP to the node N2.

The pull-low unit 202 determines whether to pull down the voltage of the node N2 according to the control signal pulse_in. The pull-low unit 202 may include an N-type metal oxide semiconductor (NMOS) M7. The gate of the NMOS M7 is coupled to the control signal pulse_in, the source thereof is coupled to GND, and the drain thereof is coupled to the node N2.

When the control signal pulse_in is at logic high level, the pull-low unit 202 pulls the voltage of the node N2 down to ground. When the control signal pulse_in is at logic low level, the pull-low unit 202 does not pull down the voltage of the node N2, and the input signal INP conducted by the transmission gate 201 is transmitted to the first terminal of the boost capacitor 203 (i.e. to the node N2).

The first terminal of the boost capacitor 203 is coupled to the node N2, and the second terminal thereof is coupled to a node N3. The boost capacitor 203 is coupled to GND for being discharged according to the pull-low unit 202. In other words, when the pull-low unit 202 operates normally, the pull-low unit 202 pulls the voltage at the node N2 to GND level, namely, the boost capacitor 203 is discharged. In addition, the voltage level at the node N3 of the boost capacitor 203 is affected by the operation state of the voltage division unit 204. For example, when the voltage division unit 204 operates normally, the voltage division unit 204 sends a divided voltage (for example, 0.1V) to the node N3, and then the boost capacitor 203 is charged. Whether the pull-low unit 202 and the voltage division unit 204 operate normally is determined according to the logic level of the control signal pulse_in. Thus, it can be considered that the boost capacitor 203 is charged or discharged according to the logic level of the control signal pulse_in. As described above, the boost capacitor 203 can be reset to 0V and then recharged repeatedly so that drop-out of the input signal of the receiver unit 205 caused by leakage current of the boost capacitor 203 can be prevented.

Additionally, the boost capacitor 203 couples the input signal INP to the input terminal INPUT of the receiver unit 205 according to the on/off state of the transmission gate 201. In other words, when the transmission gate 201 conducts the input signal INP to the node N2, the voltage at the node N3 is equal to the total of the input signal INP and the divided voltage (for example, 0.1V) through the coupling effect of the boost capacitor 203. Below, this operation will be described in detail.

The voltage division unit 204 determines whether to send the divided voltage to the node N3 according to the control signal pulse_in. The voltage division unit 204 includes resistors R1 and R2 and transistors M5 and M6. The first terminal of the resistor R1 is coupled to the voltage source VDD, and the second terminal thereof is coupled to the drain of the transistor M6 and the first terminal of the resistor R2. The first terminal of the resistor R2 is coupled to both the drain of the transistor M6 and the second terminal of the resistor R1, and the second terminal thereof is coupled to the drain of the transistor M5.

The gate of the transistor M6 is coupled to the control signal pulse_in, the drain thereof is coupled to both the second terminal of the resistor R1 and the first terminal of the resistor R2, and the source thereof is coupled to the node N3. The gate of the transistor M5 is coupled to the control signal pulse_in, the drain thereof is coupled to the second terminal of the resistor R2, and the source thereof is coupled to ground.

When the control signal pulse_in is at logic high level, the resistors R1 and R2 divide the voltage source VDD, and the transistor M6 is turned on to send the divided voltage to the node N3. The value of the divided voltage is determined by the resistance ratio between the resistors R1 and R2. In following description, the divided voltage is assumed to be 0.1V; however, the present embodiment is not limited thereto. When the control signal pulse_in is at logic low level, the transistor M6 is turned off so that the node N3 is not affected by the voltage division unit 204.

The receiver unit 205 includes two input terminals (INPUT and VREF) and an output terminal. The first input terminal INPUT thereof is coupled to the node N3, and the second input terminal VREF thereof is coupled to a reference voltage VREF. In the present embodiment, the reference voltage VREF may be 0.85V. The output terminal of the receiver unit 205 outputs the output signal outp. The receiver unit 205 compares a voltage received by the first input terminal INPUT thereof with the reference voltage VREF of the second input terminal VREF. If the voltage received by the first input terminal INPUT is higher than the reference voltage VREF, the output terminal of the receiver unit 205 outputs the output signal outp at logic high level (for example, 1.5V). If the voltage received by the first input terminal INPUT is lower than the reference voltage VREF, the output terminal of the receiver unit 205 outputs the output signal outp at logic low level (for example, 0V).

Figure 3:
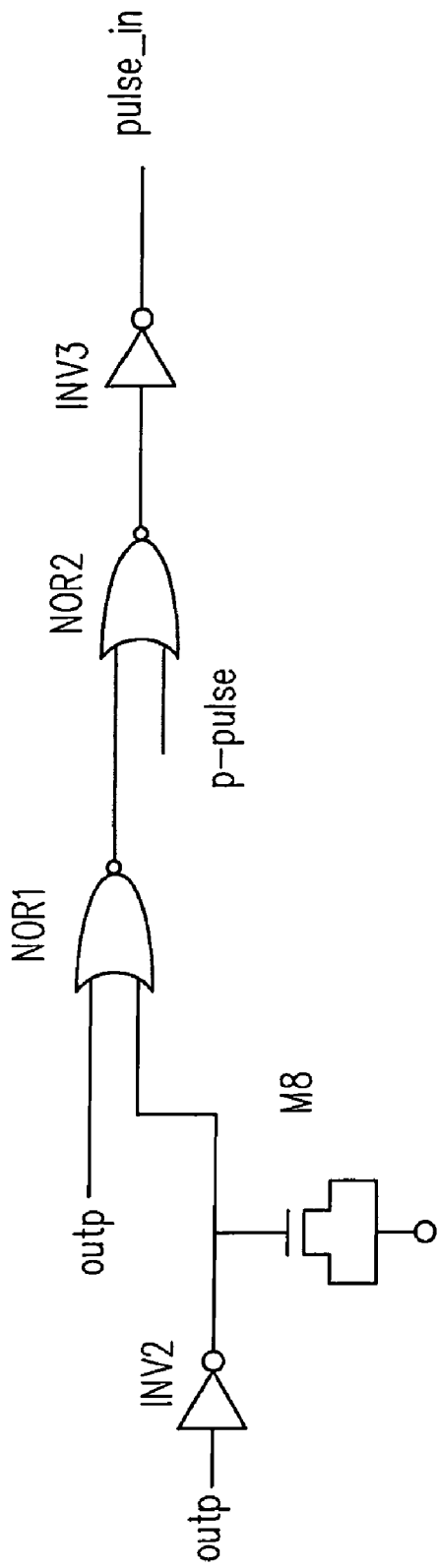
FIG. 3 is a diagram of a control signal generator.

FIG. 3 illustrates generation of the control signal pulse_in. The control signal generator 300 includes two inverters INV2 and INV3, a transistor M8, and two NOR gates NOR1 and NOR2. The control signal generator 300 generates the control signal pulse_in for controlling the transmission gate 201, the pull-low unit 202, and the voltage division unit 204.

The input terminal of the inverter INV2 receives the output signal outp from the receiver unit 205, and the output terminal thereof is coupled to both the gate of the transistor M8 and the second input terminal of the NOR gate NOR1. The source and the drain of the transistor M8 are both coupled to GND, and the gate thereof is coupled to both the output terminal of the inverter INV2 and the second input terminal of the NOR gate NOR1.

Figure 4:
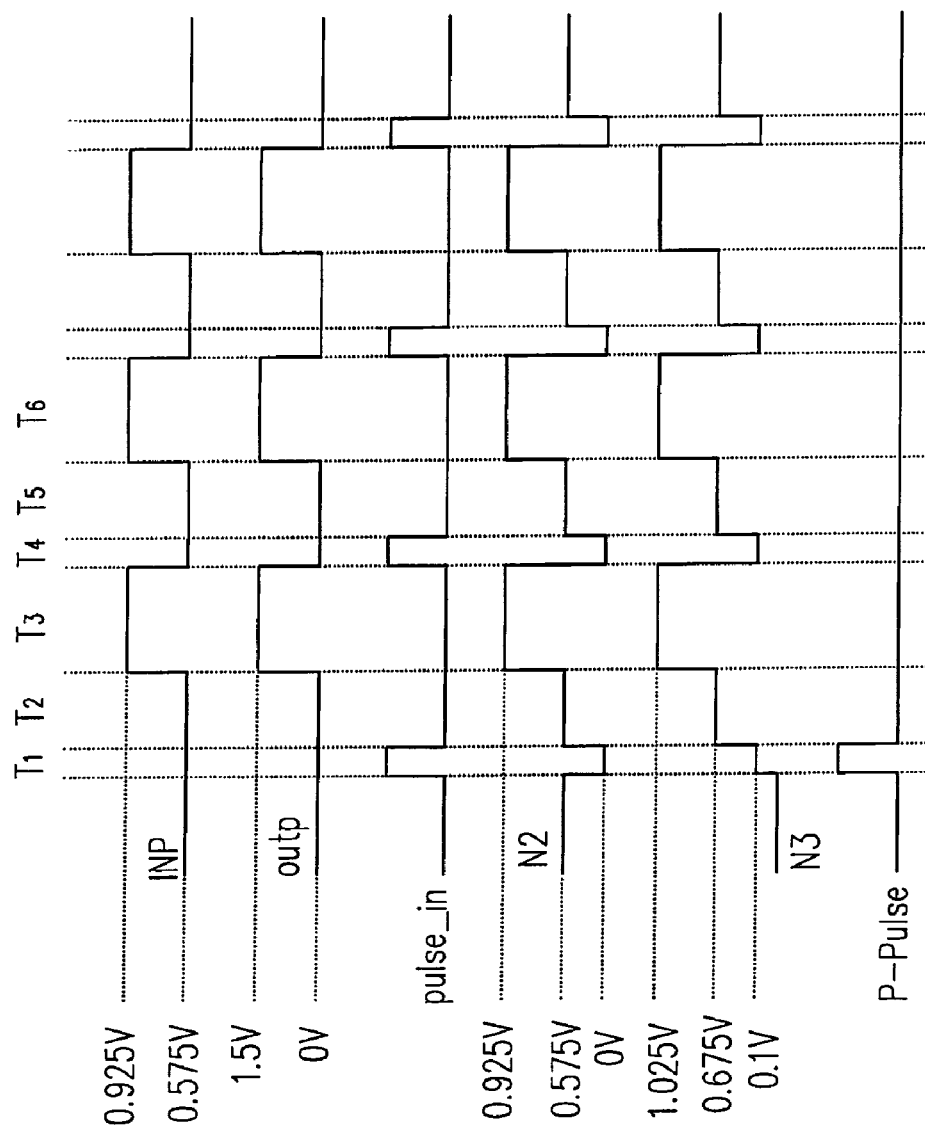
FIG. 4 illustrates signal waveforms at different time periods in the signal receiver circuit according to the embodiment of the present invention.

The first input terminal of the NOR gate NOR1 is coupled to the output signal outp of the receiver unit 205, the second input terminal thereof is coupled to both the gate of the transistor M8 and the output terminal of the inverter INV2, and the output terminal thereof is coupled to the first input terminal of the NOR gate NOR2. The first input terminal of the NOR gate NOR2 is coupled to the output terminal of the NOR gate NOR1, the second input terminal thereof is coupled to the power on pulse p_pulse, and the output terminal thereof is coupled to the input terminal of the inverter INV3. The input terminal of the inverter INV3 is coupled to the output terminal of the NOR gate NOR2, and the output terminal thereof outputs the control signal pulse_in. The power on pulse p_pulse_indicates power on situation. As shown in FIG. 4, the power on pulse p_pulse is asserted for example when the circuit is powered on.

The transistor M8 may be considered as an equivalent capacitor because the source and drain thereof are coupled to each other. When the output signal outp is at logic low level, the first input terminal of the NOR gate NOR1 is at logic low level, and since the second input terminal thereof is coupled to the output terminal of the inverter INV2 and the gate of the transistor M8 and the transistor M8 is considered as an equivalent capacitor, the logic high level output by the inverter INV2 is discharged by the transistor M8 to ground level, and accordingly the second input terminal of the NOR gate NOR1 is at logic low level. Thereby, the NOR gate NOR1 outputs a logic high level to the first input terminal of the NOR gate NOR2, and the signal p_pulse received by the second input terminal of the NOR gate NOR2 is at logic low level. Thus, the NOR gate NOR2 outputs a logic low level to the inverter INV3, and the inverter INV3 inverts the output signal (the logic low level) of the NOR gate NOR2 into a logic high level and outputs the logic high level to the control signal pulse_in.

However, when the transistor M8 is charged to a logic high level, the second input terminal of the NOR gate NOR1 is at logic high level, and the first input terminal of the NOR gate NOR1 is still at logic low level, thus, the NOR gate NOR1 outputs the logic low level to the first input terminal of the NOR gate NOR2. The signal p_pulse at the second input terminal of the NOR gate NOR2 is still at the logic low level, and thus, the NOR gate NOR2 outputs a logic high level to the inverter INV3, and the inverter INV3 inverts the logic high level into a logic low level and outputs the logic low level to the control signal pulse_in.

Accordingly, after the output signal outp transits into logic low level, the control signal pulse_in transits (for example, from logic low level to logic high level) and maintains at the logic high level for some time. After that, the control signal pulse_in transits back to logic low level. In addition, when the power on pulse p_pulse transits into logic high level (i.e. the signal receiver circuit is just powered on), the control signal pulse_in also transits into logic high level. Moreover, substantially, the control signal pulse_in maintains at logic low level in all other time.

FIG. 4 illustrates signal waveforms of the signal receiver circuit 200 at different time periods in the present embodiment. The situations during time periods T1, T2, T3, T4, T5, and T6 will be described in detail. During time period T1, the signal receiver circuit 200 is just powered on. Here, the power on pulse p_pulse is at logic high level, and thus, the control signal pulse_in is also at logic high level. Accordingly, the transmission gate 201 does not conduct the input signal INP to the node N2, the pull-low unit 202 pulls down the voltage of the node N2 to 0V, and the voltage division unit 204 sends the divided voltage 0.1V to the node N3 to charge the boost capacitor 203 to 0.1V. As shown in FIG. 4, during the time period T1, the voltages at the nodes N2 and N3 are respectively 0V and 0.1V. Here, the input signal INP of the signal receiver circuit 200 is 0.575V, and the output signal outp is 0V.

During the time period T2, the power on pulse p_pulse has transit into logic low level. Since the output signal outp is also at logic low level, the control signal pulse_in is at logic low level. Accordingly, the transmission gate 201 conducts the input signal INP to the node N2, the pull-low unit 202 stops pulling down the voltage at node N2, and the voltage division unit 204 stops sending the divided voltage 0.1V to the node N3, so that the boost capacitor 203 conducts the voltage at the node N2 to the node N3. Thus, as shown in FIG. 4, during the time period T2, the voltage at the node N2 is the voltage of the input signal INP, which is 0.575V, and the voltage at the node N3 is the total of the voltage of the input signal INP and the voltage 0.1V stored in the boost capacitor 203, which is 0.675V. Besides, the input signal INP of the signal receiver circuit 200 is 0.675V, and the output signal outp is still 0V.

During the time period T3, the input signal INP transits into logic high level (0.925V). Here the control signal pulse_in is still at logic low level. Thus, the transmission gate 201 conducts the input signal INP to the node N2, the pull-low unit 202 stops pulling down the voltage at the node N2 to 0V, and the voltage division unit 204 stops sending the divided voltage 0.1V to the node N3, so that the boost capacitor 203 transmits the voltage at the node N2 to the node N3. Accordingly, as shown in FIG. 4, during the time period T3, the voltage at the node N2 is the voltage of the input signal INP, which is 0.925V, and the voltage at the node N3 is the total of the voltage of the input signal INP and the voltage 0.1V stored in the boost capacitor 203, which is 1.025V. Here the output signal outp of the signal receiver circuit 200 is 1.5V.

During the time period T4, the input signal INP of the signal receiver circuit 200 transits again into logic low level (0.575V), and the output signal outp is also at logic low level. Thus, the control signal pulse_in is at logic high level. Accordingly, the transmission gate 201 does not conduct the input signal INP to the node N2, the pull-low unit 202 pulls down the voltage at the node N2 to 0V again, and the voltage division unit 204 also sends the divided voltage 0.1V to the node N3 again to reset and recharge the boost capacitor 203. Thus, as shown in FIG. 4, during the time period, T4, the voltages at the nodes N2 and N3 are respectively 0V and 0.1V. Here the power on pulse p_pulse is still at logic low level.

During the time period T5, when the output signal outp has been kept at logic low level for a while, the control signal pulse_in has transit from logic high level into logic low level, and the input signal INP is still 0.575V. The transmission gate 201 conducts the input signal INP to the node N2, the pull-low unit 202 stops pulling down the voltage at the node N2 to 0V, and the voltage division unit 204 also stops sending the divided voltage 0.1V to the node N3, so that the boost capacitor 203 transmits the input signal INP at node N2 to node N3. Accordingly, as shown in FIG. 4, during the time period T5, the voltage at the node N2 is the voltage of the input signal INP, which is 0.575V, and the voltage at the node N3 is the total of the voltage of the input signal INP and the voltage 0.1V stored in the boost capacitor 203, which is 0.675V. Here, the power on pulse p_pulse is still at logic low level.

During the time period T6, the input signal INP of the signal receiver circuit 200 transits to logic high level (0.925V), and here, the control signal pulse_in is still at logic low level. Thus, the transmission gate 201 conducts the input signal INP to node N2, the pull-low unit 202 stops pulling down the voltage to the node N2 to 0V, and the voltage division unit 204 also stops sending the divided voltage 0.1 V to the node N3, so that the boost capacitor 203 transmits the voltage at the node N2 to the node N3. Accordingly, as shown in FIG. 4, during the time period T6, the voltage at the node N2 is the voltage of the input signal INP, which is 0.925V, and the voltage at the node N3 is the total of the voltage of the input signal INP and the voltage 0.1V stored in the boost capacitor 203, which is 1.025V. Here, the output signal outp of the signal receiver circuit 200 is 1.5V.

In overview, in the present embodiment, the boost capacitor 203 is adopted for boosting the input voltage INPUT of the signal receiver circuit so that the duty cycle of the output signal outp of the signal receiver circuit can achieve a full swing. Moreover, according to the control signal pulse_in, the boost capacitor 203 is controlled to perform various functions (for example, conducting, charging, resetting and recharging) by turning on/off the transmission gate 201, the pull-low unit 202, and the voltage division unit 204. Thereby, the signal receiver circuit according to the embodiment of the present invention can efficiently boost the input signal INP by 0.1V, without any problems like leakage current or insufficient current.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A signal receiver circuit, comprising:
a transmission gate, having an input terminal for receiving an input signal, an output terminal coupled to a first node, and a control terminal coupled to a control signal, the transmission gate determining whether to conduct the input signal according to the control signal;
a pull-low unit, determining whether to pull down a voltage at the first node according to the control signal;
a boost capacitor, having a first terminal coupled to the first node, and a second terminal coupled to a second node;
a voltage division unit, determining whether to divide a reference voltage and send a divided voltage to the second node according to the control signal; and
a receiver unit, having a first input terminal coupled to the second node, a second input terminal coupled to a voltage source, and an output terminal for outputting an output signal;
wherein a logic high level and a logic low level of the second node are both higher than a logic high level and a logic low level of the input signal.

2. The signal receiver circuit according to claim 1, wherein the voltage division unit comprises:
a first resistor, having a first terminal coupled to the reference voltage, and a second terminal;
a second resistor, having a first terminal coupled to the second terminal of the first resistor, and a second terminal;
a first transistor, having a first terminal coupled to ground, a second terminal coupled to the second terminal of the second resistor, and a control terminal coupled to the control signal; and
a second transistor, having a first terminal coupled to the second node, a second terminal coupled to the second terminal of the first resistor and the first terminal of the second resistor, and a control terminal coupled to the control signal.

3. The signal receiver circuit according to claim 1, wherein the pull-low unit comprises a third transistor having a first terminal coupled to ground, a second terminal coupled to the first node, and a control terminal coupled to the control signal.

4. The signal receiver circuit according to claim 1 further comprising a first inverter, wherein the first inverter inverts the control signal and transmits the inverted control signal to the control terminal of the transmission gate.

5. The signal receiver circuit according to claim 1 further comprising a control signal generator, wherein the control signal generator generates the control signal according to a power on pulse and the output signal.

6. The signal receiver circuit according to claim 5, wherein the control signal generator comprises:
a second inverter, having an input terminal coupled to the output signal, and an output terminal;
a fourth transistor, having a first terminal and a second terminal coupled with each other, and a control terminal coupled to ground;
a first NOR gate, having a first input terminal coupled to the output signal, a second input terminal coupled to the output terminal of the second inverter, and an output terminal;
a second NOR gate, having a first input terminal coupled to the output terminal of the first NOR gate, a second input terminal coupled to the power on pulse, and an output terminal; and
a third inverter, having an input terminal coupled to the output terminal of the second NOR gate, and an output terminal for outputting the control signal.

7. A voltage booster, suitable for a signal receiver circuit of a semiconductor memory, the voltage booster comprising:
a transmission gate, determining whether to conduct an input signal according to a control signal;
a pull-low unit, determining whether to pull down a voltage at a first node according to the control signal;
a boost capacitor, having a first terminal coupled to the first node, and a second terminal coupled to a second node;
a voltage division unit, determining whether to divide a reference voltage and send a divided voltage to the second node according to the control signal; and
a control signal generator, generating the control signal according to a power on state and an output signal of the signal receiver circuit;
wherein,
a signal on the second node is used as an input signal of the receiver unit;
through the coupling effect of the boost capacitor, a logic high level and a logic low level of the input signal of the receiver unit are both higher than a logic high level and a logic low level of the input signal of the voltage booster.

8. The voltage booster according to claim 7, wherein the control signal generator generates the control signal at logic high level when the output signal of the signal receiver circuit transits.

9. The voltage booster according to claim 7, wherein the control signal generator generates the control signal at logic high level when the signal receiver circuit is started up.

10. The voltage booster according to claim 7, wherein the transmission gate has an input terminal for receiving the input signal, an output terminal coupled to the first node, and a control terminal coupled to the control signal.

11. The voltage booster according to claim 7, wherein the voltage division unit comprises:
   a first resistor, having a first terminal coupled to the reference voltage, and a second terminal;
   a second resistor, having a first terminal coupled to the second terminal of the first resistor, and a second terminal;
   a first transistor, having a first terminal coupled to ground, a second terminal coupled to the second terminal of the second resistor, and a control terminal coupled to the control signal; and
   a second transistor, having a first terminal coupled to the second node, a second terminal coupled to the second terminal of the first resistor and the first terminal of the second resistor, and a control terminal coupled to the control signal.

12. The voltage booster according to claim 7, wherein the pull-low unit comprises a third transistor having a first terminal coupled to ground, a second terminal coupled to the first node, and a control terminal coupled to the control signal.

13. The voltage booster according to claim 7 further comprising a first inverter, wherein the first inverter inverts the control signal and transmits the inverted control signal to the control terminal of the transmission gate.

14. The voltage booster according to claim 7, wherein the control signal generator comprises:
   a second inverter, having an input terminal coupled to the output signal of the signal receiver circuit, and an output terminal;
   a fourth transistor, having a first terminal and a second terminal coupled with each other, and a control terminal coupled to ground;
   a first NOR gate, having a first input terminal coupled to the output signal, a second input terminal coupled to the output terminal of the second inverter, and an output terminal;
   a second NOR gate, having a first input terminal coupled to the output terminal of the first NOR gate, a second input terminal coupled to the power on pulse, and an output terminal; and
   a third inverter, having an input terminal coupled to the output terminal of the second NOR gate, and an output terminal for outputting the control signal.

\* \* \* \* \*